(12) United States Patent
Ramzan et al.

(10) Patent No.: US 10,027,010 B2
(45) Date of Patent: Jul. 17, 2018

(54) PRINTED CIRCUIT BOARD STRUCTURE AND METHOD OF MANUFACTURING USING WIDEBAND MICROSTRIP LINES

(71) Applicant: UNITED ARAB EMIRATES UNIVERSITY, Al Ain (AE)

(72) Inventors: Rashad Ramzan, Al Ain (AE); Omar Farooq Sidiqui, Madinah (SA); Azam Beg, Al Ain (AE)

(73) Assignee: United Arab Emirates University (AE)

( * ) Notice: Subject to any disclaimer, the term of this patent is extended or adjusted under 35 U.S.C. 154(b) by 91 days.

(21) Appl. No.: 14/943,938

(22) Filed: Nov. 17, 2015

(65) Prior Publication Data
US 2017/0141447 A1    May 18, 2017

(51) Int. Cl.
| | |
|---|---|
| H01P 5/02 | (2006.01) |
| H01P 3/08 | (2006.01) |
| H05K 3/12 | (2006.01) |
| H05K 1/02 | (2006.01) |
| B33Y 10/00 | (2015.01) |
| B33Y 80/00 | (2015.01) |

(52) U.S. Cl.
CPC ............. *H01P 3/081* (2013.01); *H05K 1/025* (2013.01); *B33Y 10/00* (2014.12); *B33Y 80/00* (2014.12)

(58) Field of Classification Search
CPC .................................... H01P 3/08; H05K 3/12
USPC ......................................................... 333/238
See application file for complete search history.

(56) References Cited

U.S. PATENT DOCUMENTS

| | | | | | |
|---|---|---|---|---|---|
| 5,262,739 | A | * | 11/1993 | Dalman | .................... H01P 5/10 333/26 |
| 2005/0133922 | A1 | * | 6/2005 | Fjelstad | ................. H01L 23/13 257/758 |

* cited by examiner

*Primary Examiner* — Stephen E Jones
*Assistant Examiner* — Scott S Outten
(74) *Attorney, Agent, or Firm* — Hayes Soloway PC

(57) ABSTRACT

There is provided a printed circuit board structure, a dielectric substrate structure and a method of manufacturing thereof using wideband microstrip lines for reducing signal reflection, resonance and radiation for maintaining signal quality. The widths of certain portions of the wideband microstrips and underlying substrate portions are tapered gradually for achieving a reduction in a signal reflection, resonance and radiation therefore resulting in maintaining signal quality.

22 Claims, 6 Drawing Sheets

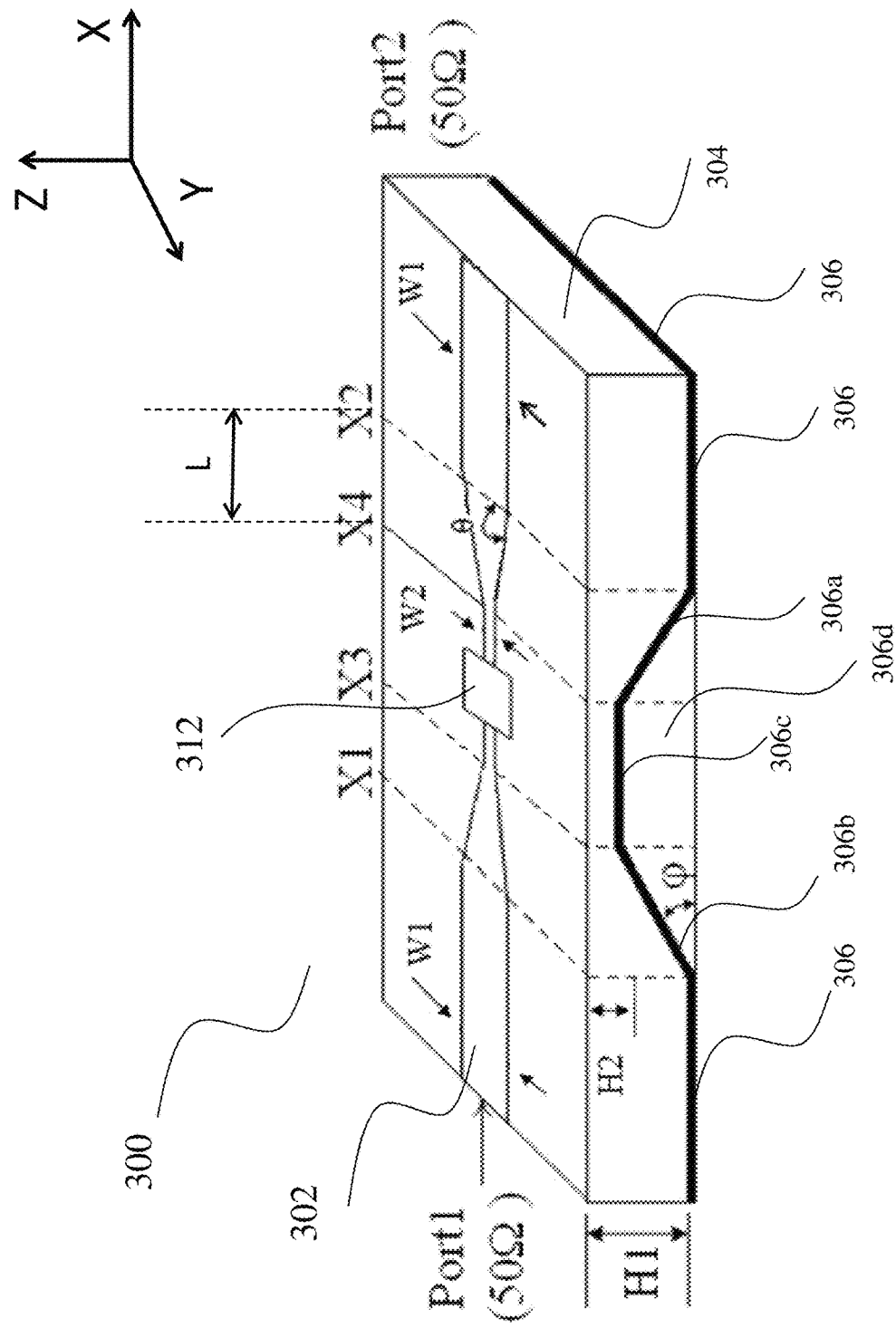
Figure: 3a

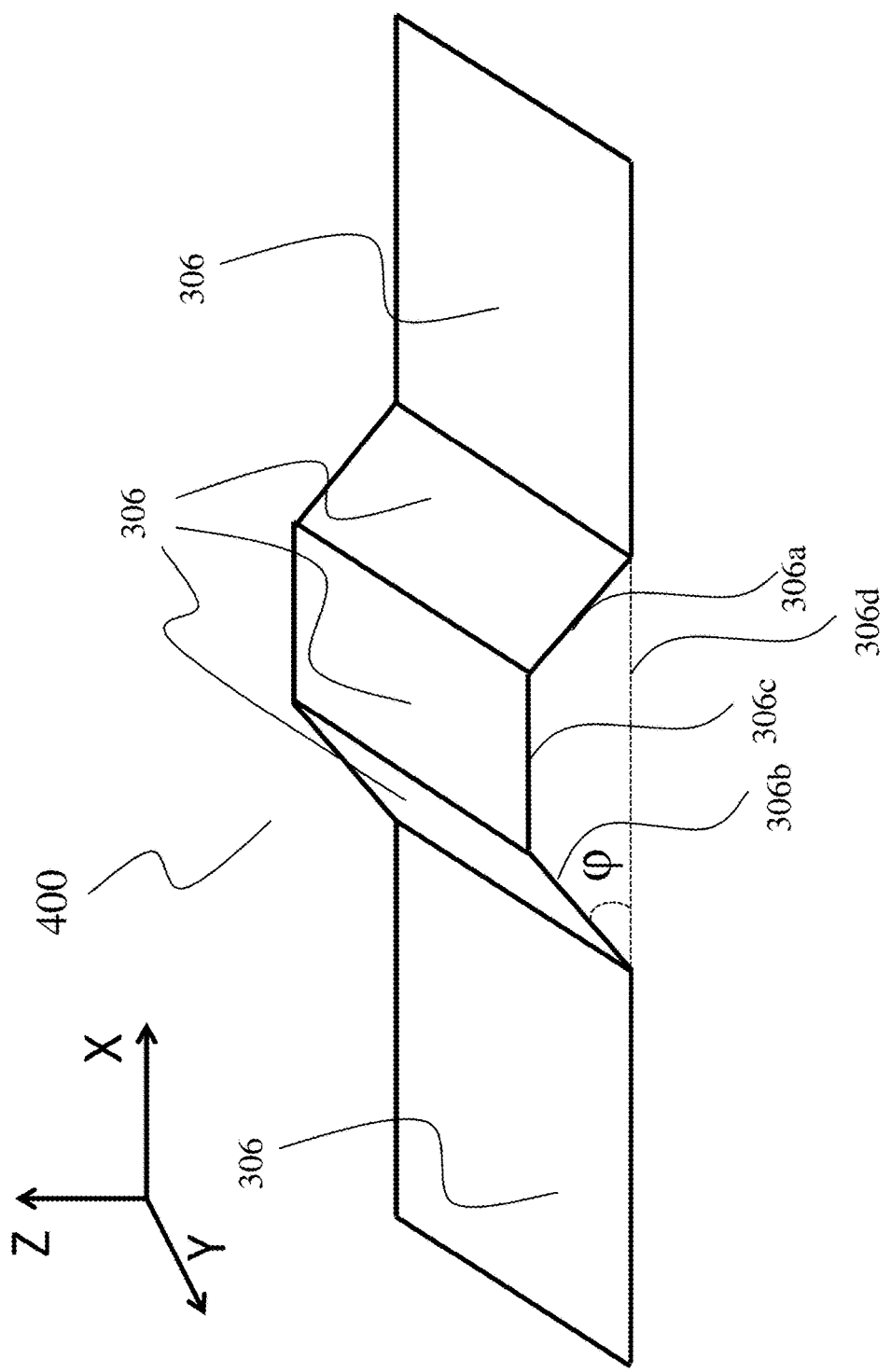
Figure: 3c

PRINTED CIRCUIT BOARD STRUCTURE AND METHOD OF MANUFACTURING USING WIDEBAND MICROSTRIP LINES

FIELD OF THE DISCLOSURE

The present invention relates to structures and methods of manufacturing printed circuit boards (PCB) and the substrates used in PCBs, and more particularly to a PCB structure, a dielectric substrate structure and a method of manufacturing thereof using wideband microstrip lines for reducing signal reflection, resonance and radiation for maintaining signal quality.

BACKGROUND OF THE DISCLOSURE

Microstrip transmission lines are very popular in the radio frequency (RF) and microwave product design because of their lower cost and lower profile compared to the other transmission media such as the waveguides and striplines. Like the waveguides, a microstrip transmission line is a transmission medium that guides an Electro-Magnetic Wave (EM wave) between two points on a printed circuit board (PCB). FIG. 1 illustrates a traditional signal transmission model 100 in a PCB using a microstrip 102 having a width "W" sitting over a dielectric substrate 104 having a thickness "H" and a ground plane 106.

A microstrip transmission line is made up of a conducting strip placed over a dielectric substrate. The dielectric substrate comprises a ground plane placed below the substrate. The substrate in a PCB is commonly made up of FR-4. At lower frequencies, the FR-4 material is commonly employed as the dielectric substrate occupying the region between the conductive strip and the ground plane. The FR-4 material is much more cost effective as compared to the other high frequency substrates such as RT/Duroid® and hence FR4 material is much popular in the PCB product design. When using a PCB with FR4 material for high frequency applications, the conducting strips have to be wide enough to enable a high transfer rate. However, wide transmission lines will have to be tapered in proximity of the PCB die in order to allow physical connection with the die. When the FR-4 substrate is used at high frequencies, it results in a drastic change in the characteristic impedance ($Z_0$) due to the tapering of the conducting strips. The change in the characteristic impedance ($Z_0$) leads to high reflections, thereby restricting the conducting strip's bandwidth and data rate.

The current digital technology demands high data rates in the tune of Gigabits per second which means that interconnects (which include the connectors, the PCB transmission lines, and the chip bond wires) as well as the inputs-outputs (IOs) should have bandwidth wide enough to accommodate the Gigabit per second data transfer rates. Such high and wide bandwidth mandates that the characteristic impedance ($Z_0$) be controlled to avoid signal reflections, resonance and radiations which result in signal transmission losses.

One traditional approach for manufacturing wideband employs the use of specialized and thus expensive Radio Frequency (RF) packages and PCBs using expensive high permittivity substrate materials such as ceramic, mica, alumina and RT/Duroid®. In such a case, the tapering of the microstrip is not required. These special materials have low dielectric loss and attenuation of the signal is also minimal. The downside is that these special materials have high cost and subsequently higher manufacturing cost of PCBs. Accordingly the final PCB structure becomes very costly rendering its use unpractical for today's low-cost, mass-produced, and throwaway type commercial electronics gadgets.

As illustrated in FIG. 2a, Another existing approach is to change the substrate's (204) thickness H1 by introducing a second conducting plane 208 in between the top conducting strip 202 and the original ground plane 206. The structural change in the substrate's height allows much narrower transmission lines 202, W2, in the vicinity of the die (chip) 212 thus providing the flexibility of a dense microstrip 200 layout. In this structural change approach, the two ground planes, 206 and 208, are stitched together using the multiple vias 210 consisting of electrical connections between the ground planes. The abrupt change in the substrate's height and the presence of vias 210 results in large amount of transmission losses due to the presence of resonances and radiation as illustrated in FIG. 2b. Hence the proposed technique did not receive industrial success.

SUMMARY OF THE DISCLOSURE

In view of the foregoing disadvantages inherent in the prior-art and the needs as mentioned above, there is a need for a PCB and the dielectric substrate structure which include all the advantages of the prior art but also overcome the drawbacks inherent in the prior art while offering some added advantages. Particularly, there is a need for a PCB structure and a dielectric material structure which allow a controlled impedance in tapered transmission lines for reducing signal reflections as well as resonance and radiations of signals passing through the transmission lines, particularly high/ultra-high frequency signals.

As a first aspect of the invention, there is provided a circuit board having a longitudinal axis and a vertical axis comprising:

a substrate extending along the vertical axis from a top layer plane to a lower layer plane;

a signal conductor having a structure formed at the substrate top layer plane and extending along the longitudinal axis from a wide portion having a width W1 to a narrow portion having a width W2 passing by a transition portion intermediary/between the wide and narrow portions tapering linearly with a tapering angle θ along a tapering length L between the wide and narrow portions;

a conductive plane having a structure formed at the substrate lower layer plane, the conductive plane comprising a low portion having a height H1 with respect to the substrate top layer plane, a top portion having a height H2 with respect to the substrate top layer plane and an inclined portion intermediary/between the low and high portions inclining linearly with an inclination angle φ between the conductive plane low and top portions;

wherein the conductive plane's low portion, top portion and inclined portion are vertically underneath and correspond in position along the longitudinal axis to the signal conductor wide portion, narrow portion and transition portion respectively; and wherein the signal conductor is adapted for transmission of signals in a frequency range having a minimum and a maximum wavelength, and wherein the tapering length L is determined based on the frequency range.

As a further aspect of the invention, there is provided a method of manufacturing a circuit board extending along a longitudinal axis and a vertical axis comprising a substrate extending along the vertical axis from a top layer plane to a low layer plane, the method comprising:

forming a signal conductor having a structure at the substrate top layer plane and extending along the longitudinal axis from a wide portion having a width W1 to a narrow portion having a width W2 passing by a transition portion intermediary/between the wide and narrow portions tapering linearly with a tapering angle θ along a tapering length L between the wide and narrow portions;

forming a conductive plane having a structure at the substrate low layer plane, the conductive plane comprising a low portion having a height H1 with respect to the substrate top layer plane, a top portion having a height H2 with respect to the substrate top layer plane and an inclined portion intermediary/between the low and high portions inclining linearly with an inclination angle φ between the conducive plane low and top portions;

wherein the conductive plane low portion, top portion and inclined portion are formed to be vertically underneath and correspond in position along the longitudinal axis to the signal conductor wide portion, narrow portion and transition portion respectively; and wherein the signal conductor is adapted for transmission of signals in a frequency range having a minimum and a maximum wavelength, and wherein the tapering length L is determined based on the frequency range.

As another aspect of the invention, there is provided a dielectric substrate extending along a vertical axis from a top layer plane to a low layer plane;

a signal trace having a structure formed at the substrate top layer plane and extending along a longitudinal axis of the substrate from a wide portion having a width W1 to a narrow portion having a width W2 passing by a transition portion intermediary/between the wide and narrow portions tapering linearly with a tapering angle θ along a tapering length L between the wide and narrow portions;

a conductive plane having a structure formed at the substrate low layer plane, the conductive plane comprising a low portion having a height H1 with respect to the substrate top layer plane, a top portion having a height H2 with respect to the substrate top layer plane and an inclined portion intermediary/between the low and high portions inclining linearly with an inclination angle φ between the conducive plane low and top portions;

wherein the conductive plane low portion, top portion and inclined portion are vertically underneath and correspond in position along the longitudinal axis to the signal conductor wide portion, narrow portion and transition portion respectively; and wherein the signal conductor is adapted for transmission of signals in a frequency range having a minimum and a maximum wavelength, and wherein the tapering length L is determined based on the frequency range.

Preferably, the tapering length L of the transition portion of the signal conductor is equal or greater than half of the minimum wavelength.

Preferably, the circuit board is a printed circuit board (PCB).

Preferably, the conductive plane is a ground plane.

Preferably, the substrate is tailored in thickness using 3D printing to define the structure of the conductive plane.

Preferably, the substrate has a cross section comprising a trapezoid along a plane defined by the longitudinal and vertical axis.

Preferably, the trapezoid is an isosceles trapezoid comprising a pair of parallel bases having base angles of equal measure and a pair of equal length legs, the parallel bases include a small base and a large base and the pair of equal length legs includes a first leg and a second leg, where the small base defines the top portion of the conductive plane, the first leg defines a first inclined portion of the conductive plane and the second leg defines a second inclined portion of the conductive plane, and where the first and second legs form respectively a first inclination angle and a second inclination angle of equal measure φ with the large base.

Preferably, the conductive plane is a continuous plane free of any via holes or step change.

Preferably, the signal conductor is a microstrip.

Preferably, the tapering angle θ is in proportionality relationship with the inclination angle φ.

Preferably, the proportionality relationship between the tapering angle θ and the inclination angle φ is given by the range: $0.5\theta \leq \varphi \leq 1.5\theta$; The exact values can be found using electromagnetic simulations of a particular geometry.

Preferably, the transition portion of the signal conductor has a variable width W' and the inclined portion of the conductive plane has a variable height H' at any specific point along the longitudinal axis, and wherein the ratio between W2 and H2 is equal to the ratio between W1 and H1 and equal to the ratio between W' and H'.

Preferably, the substrate is FR-4 and the frequency range is 300 MHz-4 GHz.

Preferably, the signal conductor structure and the conductive plane structure are adapted to control an impedance of the signal conductor all in minimizing or eliminating radiation and resonance of the transmitted signals.

This together with the other aspects of the present invention along with the various features of novelty that characterized the present disclosure is pointed out with particularity in claims annexed hereto and forms a part of the present invention. For better understanding of the present disclosure, its operating advantages, and the specified objective attained by its uses, reference should be made to the accompanying descriptive matter in which there are illustrated exemplary embodiments of the present invention.

BRIEF DESCRIPTION OF THE DRAWINGS

The advantages and features of the present disclosure will become better understood with reference to the following detailed description and claims taken in conjunction with the accompanying drawing, in which:

FIG. 2b depicts the transmission (S21) and reflection (S11) characteristics of a transmission signal using the PCB structure model in FIG. 2a;

FIG. 3a illustrates a PCB structure model in accordance with an embodiment of the present invention.

FIG. 3c illustrates a trapezoid structure of the conductive plane of the PCB structure model of FIG. 3a in accordance with an embodiment of the present invention.

DETAILED DESCRIPTION OF THE DISCLOSURE

The foregoing descriptions of specific embodiments of the present disclosure have been presented for purposes of illustration and description. They are not intended to be exhaustive or to limit the invention to the precise forms disclosed, and obviously many modifications and variations are possible in light of the above teaching. The exemplary embodiment was chosen and described in order to best explain the principles of the invention and its practical application, to thereby enable others skilled in the art to best utilize the invention and various embodiments with various modifications as are suited to the particular use contemplated.

The terms "a" and "an" herein do not denote a limitation of quantity, but rather denote the presence of at least one of the referenced item.

The terms "having", "comprising", "including", and variations thereof signify the presence of a component.

In one aspect, the present invention relates to a PCB structure and method of manufacturing the same, preferably using 3D printing, though it can also be manufactured using other techniques. Preferably, the 3D printing is used to make wide band microstrip transmission lines with a ground plane inclined in the Z dimension so as to obtain constant impedance over the transmission lines.

Figure 1:
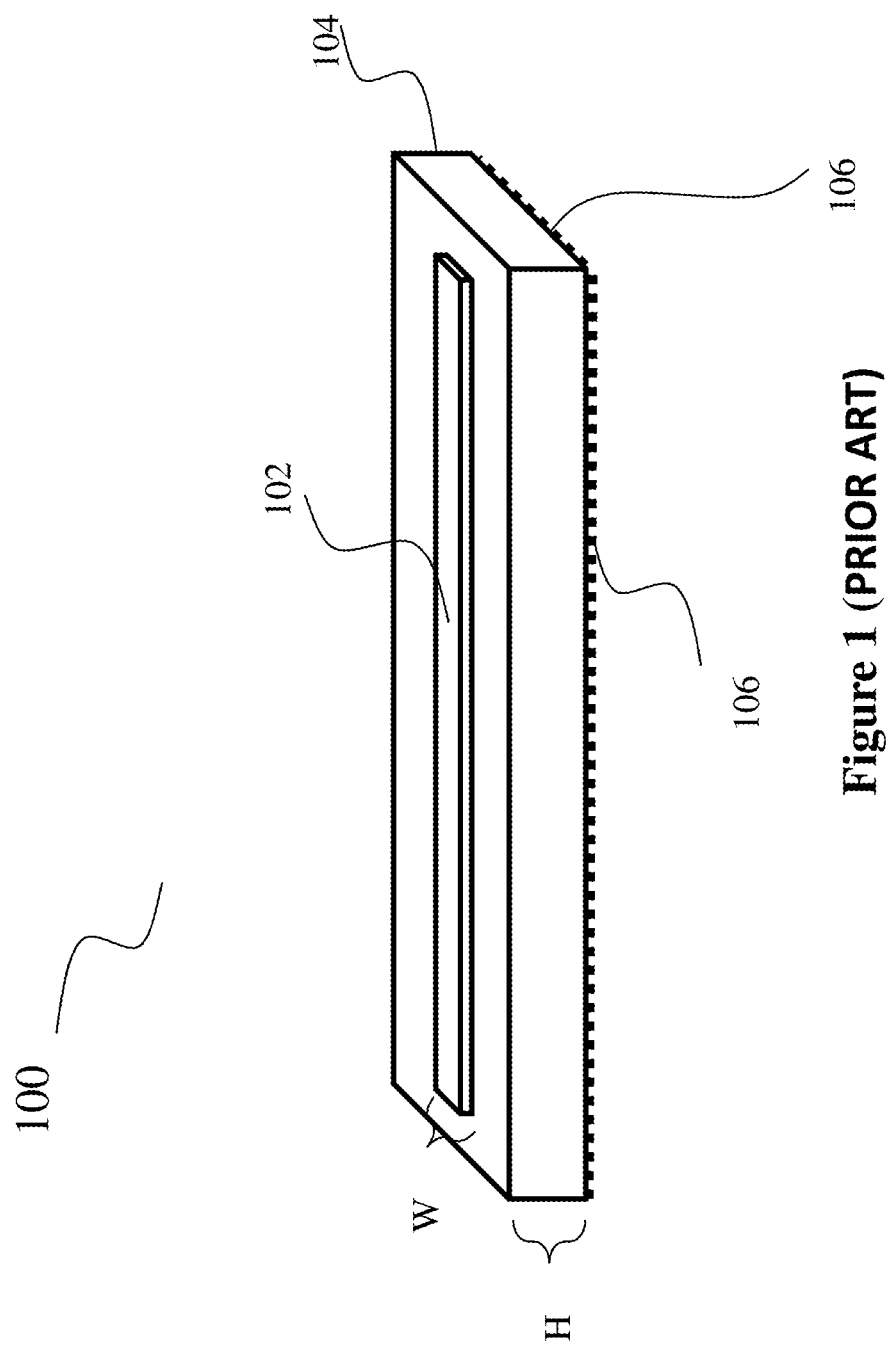
FIG. 1 illustrates a traditional signal transmission model a PCB using a microstrip.

The characteristic impedance ($Z_0$) of microstrip transmission line 102 (see FIG. 1) depends on its distributive capacitance (C) and inductance (L) and is given by the following relationship:

$$Z_o = \sqrt{\frac{L}{C}} \quad (1)$$

For a microstrip 102, the distributive inductance (L) depends only on the area of the current loop and hence its L is a nearly constant quantity. The controlling parameter is the distributive capacitance, which is strongly related to the width (W), thickness (H) and the relative permittivity ($\varepsilon_r$) of the substrate 104. For example, the increase in W or $\varepsilon_r$ (or a reduction in H) increases the distributive capacitance (C) leading to the reduction of the characteristic impedance $Z_0$.

Altering the variable distributive capacitance (C) allows change in the impedance $Z_0$. This fact can be utilized to employ low cost dielectric material such as FR-4 as dielectric substrate and nevertheless obtain constant impedance $Z_o$.

Figure 3B:
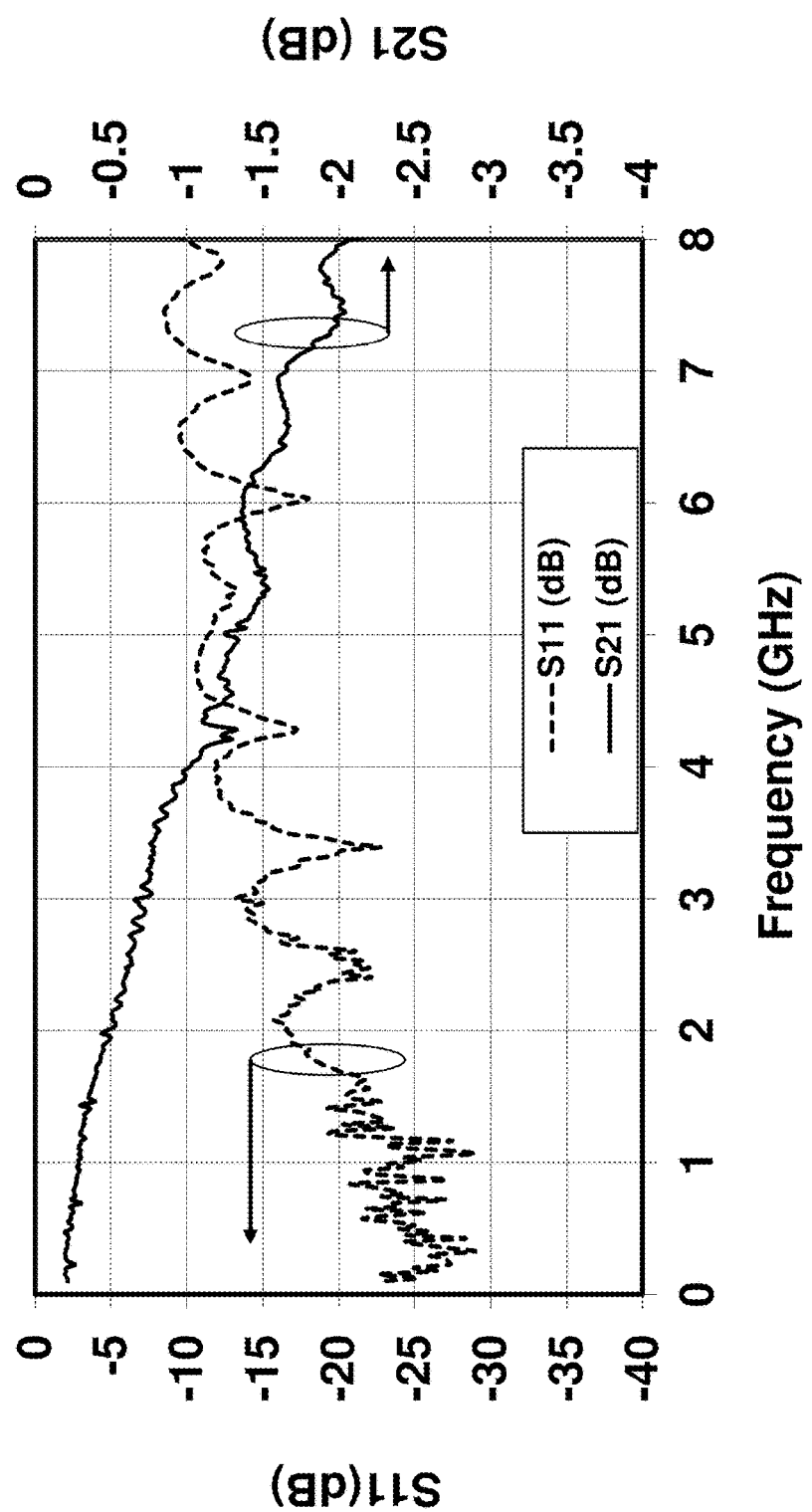
FIG. 3b depicts the transmission (S21) and reflection (S11) characteristics of a transmission signal using the PCB structure model in FIG. 3a in accordance with an embodiment of the present invention.

According to an embodiment of the invention, as illustrated in FIG. 3a, there is provided a PCB structure 300 controlling the impedance of the transmission lines in the PCB all in minimizing or eliminating the radiation and resonance losses therefore improving both transmission as well as reflection characteristics of the PCB as illustrated in FIG. 3b.

The PCB structure 300 extends in a XYZ plane and comprises transmission lines 302 having a wide portion, a tapered (narrow) portion and a transition portion subject to a linear change in width between the wide and tapered portions. The transmission lines 302 extend in the XY plane. The PCB structure comprises a substrate 304 tailored to the structure of the transmission lines 302 for controlling impedance thereof in such a manner to reduce reflection, radiation and resonance of transmitted signals. The substrate 304 extends in the XYZ plane.

The substrate 304 comprises a thick portion corresponding in position to the wide portion of the transmission lines 302, a thin portion corresponding in position to the tapered portion of the transmission lines 302, and a linear slope portion 306a and/or 306b defining a linear change in the substrate's thickness between the thick and thin portions of the substrate corresponding in position to the transition portion of the transmission lines 302. The thickness of the substrate 304 is relative to the Z plane. The thicknesses of the different portions of the substrate 304 are tailored based on the corresponding widths of the different portions of the transmission lines 302 in such a manner to control the impedance of transmitted signals within the transmission lines to reduce reflection, radiation and resonance of the transmitted signals.

The ratio between the width of a transmission line portion and the thickness of a corresponding substrate portion is constant across the PCB. The corresponding substrate portion is the portion of the substrate which is directly underneath in the vertical (Z) direction. This configuration results in obtaining narrow transmission line portions having corresponding thinner substrate portions, wide transmission line portions having corresponding thicker substrate portions and linearly tapered transmission line portions (corresponding to the transition portions) intermediate the narrow and wide transmission line portions having corresponding linearly thinned substrate portions (corresponding to the linear slope portions) intermediate the thick and thin substrate portions. The transmission line width and corresponding substrate thickness across the PCB are inversely proportional effectively resulting in controlled impedance across the transmission lines without any impedance discontinuity, and the linear reduction in width in the transition portions between the narrow and wide portions of the transmission lines matched with the corresponding linear reduction in the substrate thickness in the linear slope portions result in the reduction of resonance and radiation of transmitted signals. This is as the present PCB structure does not use any vias (viaholes) or interconnections in the substrate or any other stitching between different substrate layers, therefore enabling the reduction (or elimination) of radiation and resonance of the transmitted signals.

The PCB structure 300 comprises a die portion 312 adapted to receive a chip. The linear change in the transmission lines width and the corresponding substrate's thickness allows for incorporating much narrower transmission lines in the vicinity of the die 312 thus providing the possibility of a dense transmission lines layout. Away from the die 312, the wide transmission lines layout provides lower track losses and circuit board pin connections with reduced (or without) impedance discontinuities, radiation and resonance. The present structure allows for a reflection, radiation and resonance free transition between the circuit board pad and the transmission lines.

In the present PCB structure 300, the transition from the wide transmission line portion to the narrow transmission line portions should not be abrupt both in the vertical (along the Z plane and perpendicular to the ground) and longitudinal (along the XY plane and transmission line) directions. As depicted in FIG. 3a, the longitudinal transition should be designed in such a way that the transmission line tapers with an angle of θ. To make a longer tapering length of the transition portion, a larger tapering angle θ is desired. The preferable tapering length is more than half of the wavelength of the minimum frequency signal transmitted through the transmission line.

In the similar manner, the thickness of the substrate 304 underneath the transmission line transition portion (which corresponds to the substrate slope transition portion) also tapers off gradually and linearly from a thicker substrate layer H1 to a thinner layer H2. The inclination angle φ of the ground plane bears a proportionality relation with the angle θ. That is $0.5θ ≤ φ ≤ 1.5θ$. The optimum value of φ can be conveniently determined the full-wave numerical solutions. The relation depends upon the width of the microstrip, height from the GND plane and frequency of operation, dielectric constant and geometry of the microstrip.

Figure 2A:
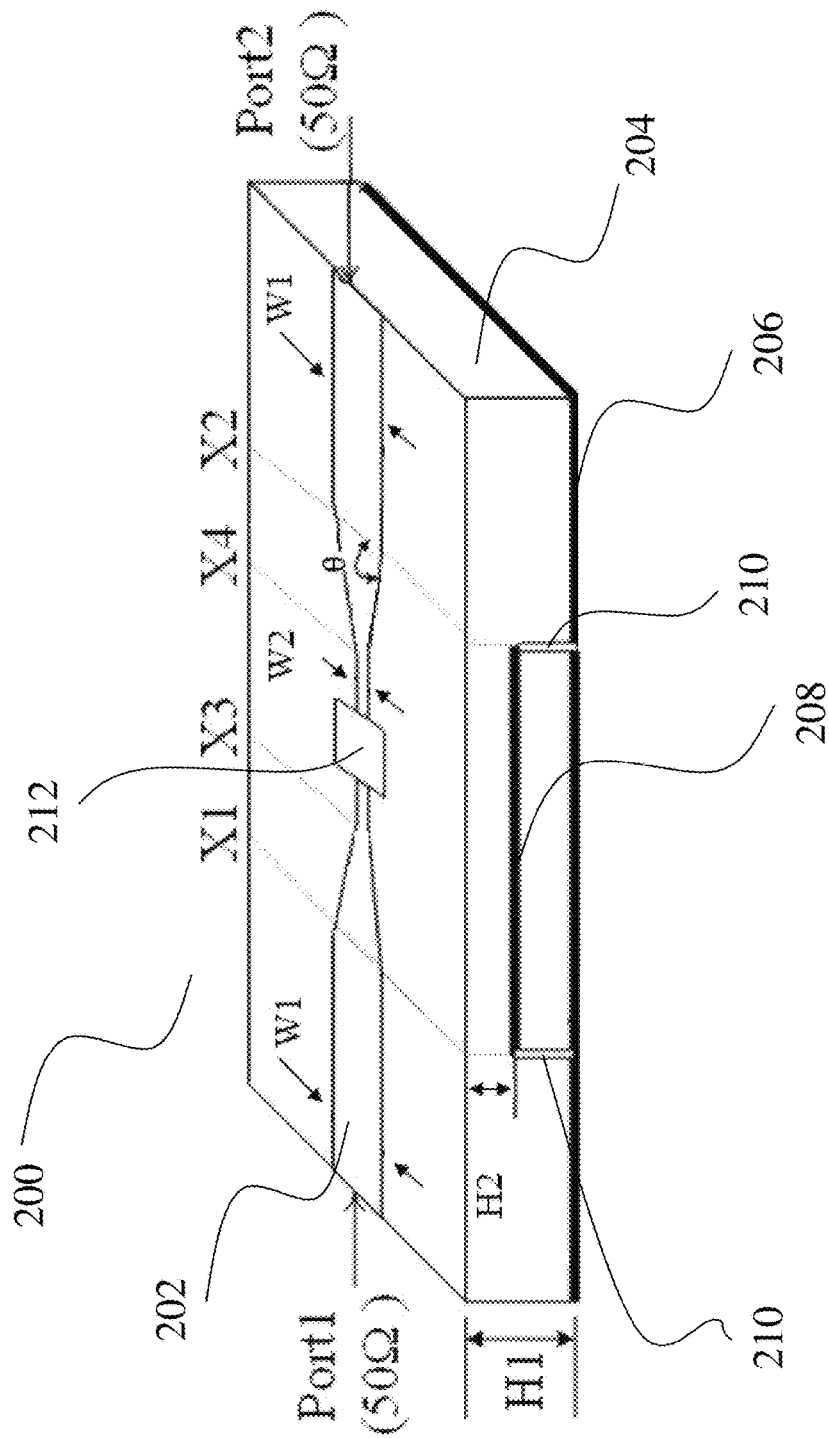
FIG. 2a illustrates a traditional PCB structure model using two ground planes having respective heights interconnected using vias.
Figure 2B:
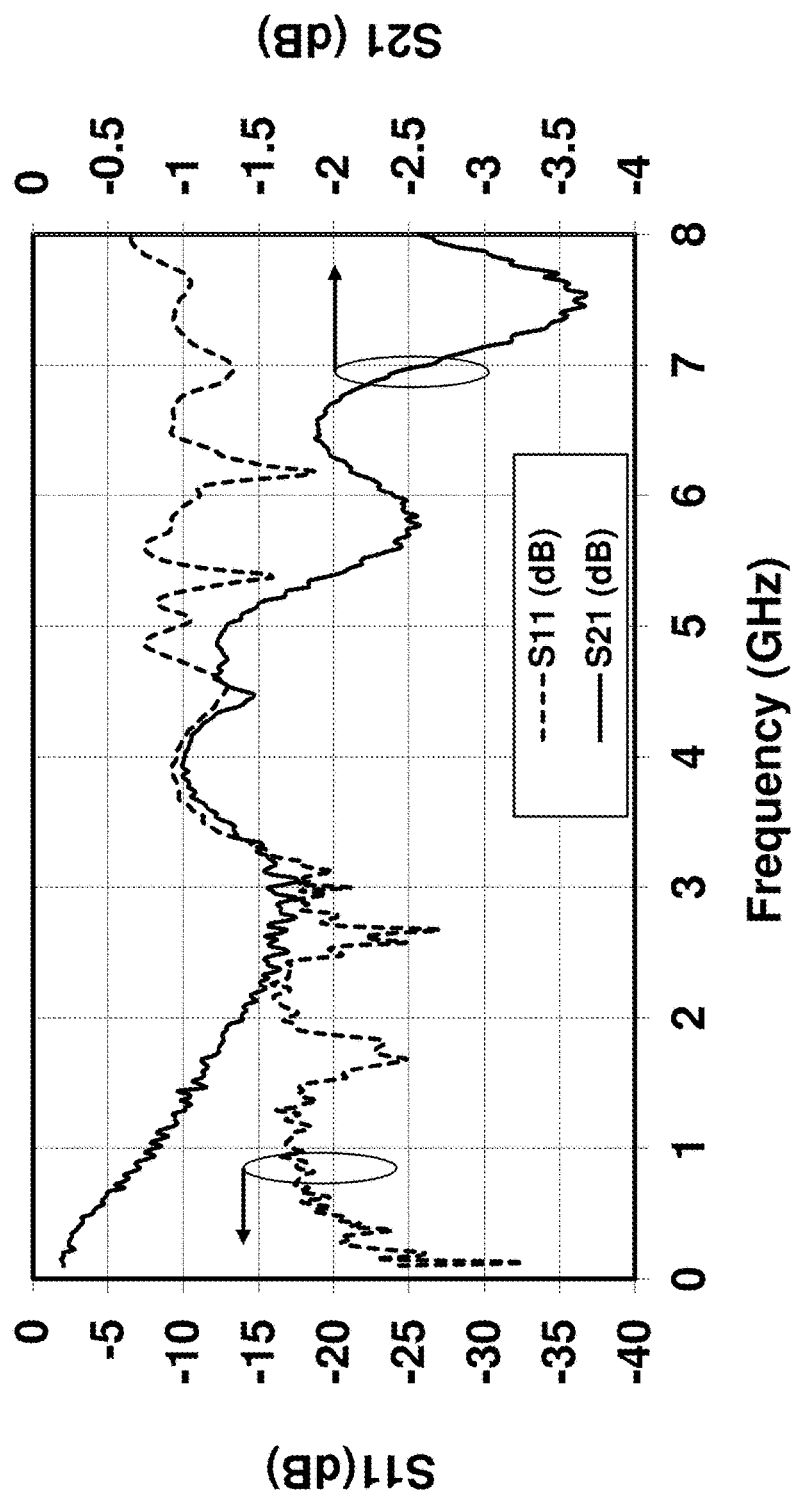

The gradual and linear tapering of the transmission line 302 and substrate results in the reduction and/or elimination of the undesired signal transmission losses caused by signal radiation and resonance. This becomes possible because of the elimination of the inductive vias (viaholes) that connected the two ground planes in the existing proposed configuration (FIG. 2a). In the present invention, a continuous slanted ground plane is obtained which is defined by the lower plane of the substrate.

The simulation results showed in FIG. 3b illustrate that the transmission line parameters (S11 and S21) are close to the reference line and the problem of radiation and resonance is also mitigated. The proposed method of transitioned trace and substrate is preferably implemented using 3D printing which can solve the problem of dense RF layout and realize high bandwidth transmission lines.

The transmission lines 302 (also named signal conductors) can be conductive strips such as a microstrip transmission lines adapted for high or ultra high speed wideband transmission of signals. The PCB structure can be manufactured with signal traces adapted to receive the transmission lines with the characteristics discussed according to the present invention. In an embodiment of the invention, the PCB structure is manufactured with the signal traces, the substrate and the ground plane only without the transmission lines which can be printed at a later stage.

In an embodiment of the invention, the PCB structure 300 comprises signal traces or transmission lines 302, a substrate 304 and a conductive plane defined by the lower plane of the substrate having a cross section along the Z plane comprising a trapezoid 400. The trapezoid structure 400 of the ground plane is formed by the variation of the substrate thickness. FIG. 3c illustrates the trapezoid structure 400 of the conductive plane along the XYZ planes. In an embodiment of the invention, the dielectric substrate 304 is a FR-4 material manufactured with a variable thickness so as to define the trapezoid structure of the ground plane. In an embodiment of the invention, the PCB structure 300 comprising the substrate material has a vertical cross-section comprising the trapezoid 400 defining the structure of the ground plane.

In an embodiment of the invention, as illustrated in FIGS. 3a and 3c, the trapezoid 400 is an isosceles trapezoid comprising a pair of parallel bases 306c and 306d having base angles of equal measure and a pair of equal length legs 306a and 306b. The parallel bases 306c and 306d include a small base 306c and a large base 306d. The pair of equal length legs 306a and 306b includes a first leg 306a and a second leg 306b.

In an embodiment of the invention, the small base 306c defines an elevated portion of the ground plane, the first leg 306a defines a first slope portion of the ground plane and the second leg 306b defines a second slope portion of the ground plane. The first and second legs 306a and 306b form respectively a first inclination angle and a second inclination angle of equal measure φ with the large base. The first and second inclination angles φ are referred herein as the inclination or the inclination angle of the ground plane.

In an embodiment of the present invention, the inclination angle of the ground plane φ is proportional to the tapering angle θ of the transmission line. Hence, the impedance change created due to the tapering of the transmission line is countered with the inclination of the ground plane.

In an embodiment of the invention, the trapezoid structure of the ground plane is manufactured by tailoring the substrate using 3D printing. In an embodiment of the invention, the signal traces or transmission lines 302 are also manufactured using 3D printing. In an embodiment of the invention, the transmission lines 302 are adapted for radiofrequency or ultra high frequency signals in the range of 300 MHz-4 GHz.

In an embodiment of the present invention, the tapering length "L" of the transition portion of the transmission line 202 varies based on the frequency range of the signals transmitted. Preferably, the tapering length "L" is larger than half of the wavelength of the minimum frequency signal transmitted through the transmission lines. The tapering length L can be varied during manufacturing by varying the tapering angle θ.

In an embodiment of the present invention as illustrated in FIG. 3a, the thickness of the substrate 304 underneath the transmission line 302 also tapers off gradually from a thicker substrate layer H1 to a thinner layer H2. The inclination angle φ of the ground plane 306 bears a proportionality relation with the tapering angle θ. The inclination of the ground plane 306 and its inclination angle φ being proportional to the tapering angle θ results in continuous slanted ground plane 306.

The inclination and tapering angles θ and φ are in the range of $0° < θ, φ < 90°$, but preferably in the range of $30° < θ, φ < 80°$ where they do not reach 90° to avoid any abrupt change and therefore any step change in the slope of the ground plane.

Hence, the PCB structure 300 preferably manufactured using 3D printing helps in achieving controlled impedance $Z_0$ of the transmission lines 302 by inclining the ground plane 306 in the Z dimension without using any step change. The use of 3D printing helps in achieving a slanted ground plane without any step change therefore allowing use of larger bandwidth transmission lines with tapered ends in proximity of the chip without affecting the quality of the signal which allows use of low cost FR-4 material as substrate 304 reducing therefore the overall cost of the PCB.

The foregoing descriptions of specific embodiments of the present invention have been presented for purposes of illustration and description. They are not intended to be exhaustive or to limit the present invention to the precise forms disclosed, and obviously many modifications and variations are possible in light of the above teaching. The embodiments were chosen and described in order to best explain the principles of the present invention and its practical application, and to thereby enable others skilled in the art to best utilize the present invention and various embodiments with various modifications as are suited to the particular use contemplated. It is understood that various omissions and substitutions of equivalents are contemplated as circumstances may suggest or render expedient, but such omissions and substitutions are intended to cover the application or implementation without departing from the spirit or scope of the present invention.

The invention claimed is:

1. A circuit board having a longitudinal axis and a vertical axis comprising:
   a substrate extending along the vertical axis from a top layer plane to a low layer plane;
      a signal conductor having a structure formed at the substrate top layer plane and extending along the longitudinal axis from a wide portion having a width (W1) to a narrow portion having a width (W2) passing by a transition portion intermediary/between the wide and narrow portions tapering linearly with a tapering angle (θ) along a tapering length (L) between the wide and narrow portions;
      a conductive plane, being formed within the substrate between the substrate top layer plane and the substrate low layer plane, the conductive plane comprising a low portion having a height (H1) with respect to the substrate top layer plane, a top portion having a height (H2) with respect to the substrate top layer plane and an inclined portion intermediary/between the low and high portions inclining linearly with an inclination angle φ between the conductive plane low and top portions, wherein the conductive plane is a continuous plane free of any vias or step change;
   wherein the substrate is uniform in thickness across the circuit board and has a cross section comprising a trapezoid structure along a plane defined by the longitudinal and vertical axis, the trapezoid structure being defined by the conductive plane and the substrate low layer plane;
   wherein the conductive plane low portion, top portion and inclined portion are vertically underneath and correspond in position along the longitudinal axis to the signal conductor wide portion, narrow portion and transition portion respectively; and
   wherein the signal conductor is adapted for transmission of signals in a frequency range having a minimum and a maximum wavelength, and wherein the tapering length (L) is determined based on the frequency range.

2. The circuit board of claim 1, wherein the tapering length (L) of the transition portion of the signal conductor is equal or greater than half of the minimum wavelength.

3. The circuit board of claim 1, wherein the circuit board is a printed circuit board (PCB).

4. The circuit board of claim 1, wherein the conductive plane is a ground plane.

5. The circuit board of claim 1, wherein the trapezoid is an isosceles trapezoid comprising a pair of parallel bases having base angles of equal measure and a pair of equal length legs, the parallel bases include a small base and a large base and the pair of equal length legs includes a first leg and a second leg, where the small base defines the top portion of the conductive plane, the first leg defines a first inclined portion of the conductive plane and the second leg defines a second inclined portion of the conductive plane, where the first and second legs form respectively a first inclination angle and a second inclination angle of equal measure (φ) with the large base, and wherein the large base is defined by the substrate low layer plane.

6. The circuit board of claim 1, wherein the signal conductor is a microstrip.

7. The circuit board of claim 1, wherein the tapering angle θ is in proportionality relationship with the inclination angle (φ).

8. The circuit board of claim 1, wherein the proportionality relationship between the tapering angle (θ) and the inclination angle (φ) is given by: $0.5*\theta \leq \varphi \leq 1.5*\theta$.

9. The circuit board of claim 1, wherein the transition portion of the signal conductor has a variable width (W') and the inclined portion of the conductive plane has a variable height (H)' at any specific point along the longitudinal axis, and wherein the ratio between the width of the narrow portion (W2) and the height of the top portion (H2) is equal to the ratio between the width of the wide portion (W1) and the height of the low portion (H1) and equal to the ratio between the variable width of the signal conductor (W') and the variable height of the conductive plane (H').

10. The circuit board of claim 1, wherein the substrate is FR-4 and the frequency range is 300 MHz-4 GHz.

11. The circuit board of claim 1, wherein the signal conductor structure and the conductive plane structure are adapted to control an impedance of the signal conductor.

12. A method of manufacturing a printed circuit board (PCB) extending along a longitudinal axis and a vertical axis comprising a substrate extending along the vertical axis from a top layer plane to a low layer plane, the method comprising:
   forming a signal conductor having a structure at the substrate top layer plane and extending along the longitudinal axis from a wide portion having a width (W1) to a narrow portion having a width (W2) passing by a transition portion intermediary/between the wide and narrow portions tapering linearly with a tapering angle (θ) along a tapering length (L) between the wide and narrow portions;
   forming a conductive plane within the substrate between the substrate top layer plane and the substrate low layer plane, having a structure at the substrate low layer plane, the conductive plane comprising a low portion having a height (H) with respect to the substrate top layer plane, a top portion having a height (H2) with respect to the substrate top layer plane and an inclined portion intermediary/between the low and high portions inclining linearly with an inclination angle (φ) between the conducive plane low and top portions,
   wherein the conductive plane is a continuous plane free of any via holes or step change;
   wherein the substrate is uniform in thickness across the circuit board and has a cross section comprising a trapezoid structure along a plane defined by the longitudinal and vertical axis, the trapezoid structure being defined by the conductive plane and the substrate low layer plane;
   wherein the conductive plane low portion, top portion and inclined portion are formed to be vertically underneath and correspond in position along the longitudinal axis to the signal conductor wide portion, narrow portion and transition portion respectively, and
   wherein the signal conductor is adapted for transmission of signals in a frequency range having a minimum and a maximum wavelength, and wherein the tapering length (L) is determined based on the frequency range.

13. The manufacturing method of claim 12, wherein the tapering length (L) of the transition portion of the signal conductor is equal or greater than half of the minimum wavelength.

14. The manufacturing method of claim 12, wherein circuit board is a printed circuit board (PCB).

15. The manufacturing method of claim 12, wherein the conductive plane is a ground plane.

16. The manufacturing method of claim 12, wherein the trapezoid is an isosceles trapezoid comprising a pair of parallel bases having base angles of equal measure and a pair of equal length legs, the parallel bases include a small base and a large base and the pair of equal length legs includes a first leg and a second leg, where the small base defines the top portion of the conductive plane, the first leg defines a first inclined portion of the conductive plane and the second leg defines a second inclined portion of the conductive plane, where the first and second legs form respectively a first inclination angle and a second inclination angle of equal measure ($\varphi$) with the large base, and wherein the large base is defined by the substrate low layer plane.

17. The manufacturing method of claim 12, wherein the signal conductor is a microstrip.

18. The manufacturing method of claim 12, wherein the tapering angle ($\theta$) is in proportionality relationship with the inclination angle ($\varphi$).

19. The manufacturing method of claim 12, wherein the proportionality relationship between the tapering angle ($\theta$) and the inclination angle ($\varphi$) is given by: $0.5*\theta \leq \varphi \leq 1.5*\theta$.

20. The manufacturing method of claim 12, wherein the transition portion of the signal conductor has a variable width (W') and the inclined portion of the conductive plane has a variable height (H') at any specific point along the longitudinal axis, and wherein the ratio between the width of the narrow portion (W2) and the height of the top portion (H2) is equal to the ratio between the width of the wide portion (W1) and the height of the low portion (H1).

21. The manufacturing method of claim 12, wherein the substrate is FR-4 and the frequency range is 300 MHz-4 GHz.

22. The manufacturing method of claim 12, wherein the signal conductor structure and the conductive plane structure are adapted to control an impedance of the signal conductor.

* * * * *